(12) United States Patent
Yamada

(10) Patent No.: US 6,479,901 B1
(45) Date of Patent: Nov. 12, 2002

(54) SEMICONDUCTOR DEVICE HAVING INTERCONNECTED EXTERNAL ELECTRODE PADS AND WIRE BONDING PADS

(75) Inventor: Shigeru Yamada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/434,487

(22) Filed: Nov. 5, 1999

(30) Foreign Application Priority Data

Dec. 21, 1998 (JP) .......................................... 10-362715

(51) Int. Cl.[7] .......................... H01L 23/48; H01L 23/29
(52) U.S. Cl. ...................... 257/774; 257/689; 257/791; 257/737; 257/738; 257/773
(58) Field of Search .................................. 257/689, 791, 257/737, 738, 773, 774

(56) References Cited

U.S. PATENT DOCUMENTS

| 5,216,278 A | | 6/1993 | Lin et al. | |
| 5,241,133 A | | 8/1993 | Mullen et al. | |
| 5,436,203 A | * | 7/1995 | Lin | 437/209 |
| 5,468,681 A | * | 11/1995 | Pasch | 437/183 |
| 5,592,025 A | * | 1/1997 | Clarke et al. | 257/774 |
| 5,640,047 A | * | 6/1997 | Nakashima | 257/738 |
| 5,805,422 A | * | 9/1998 | Otake et al. | 361/749 |
| 6,009,620 A | * | 1/2000 | Bhatt et al. | 29/852 |
| 6,060,775 A | * | 5/2000 | Ano | 257/693 |
| 6,084,295 A | * | 7/2000 | Horiuchi | 257/690 |

FOREIGN PATENT DOCUMENTS

JP          10-209321          8/1998

* cited by examiner

Primary Examiner—David E. Graybill
Assistant Examiner—James Mitchell
(74) Attorney, Agent, or Firm—Rabin & Berdo, PC

(57) ABSTRACT

A semiconductor device according to the invention of the present application includes a plurality of external electrode pads which are placed over the back of a substrate having a semiconductor chip mounted on the surface thereof, so as to be substantially parallel with the outer periphery of the substrate. A plurality of internal electrode pads respectively electrically connected to external electrodes via through holes defined in the substrate are formed over the surface of the substrate. The internal electrode pads are placed on the surface of the substrate, which corresponds to an area defined by areas in which the external electrode pads are formed and areas lying between the respective adjacent external electrode pads.

Thus, the through holes can be defined in all the areas on the substrate except for the areas in which the external electrode pads are formed. The degree of freedom of the placement of the through holes defined in the substrate is improved accordingly.

12 Claims, 4 Drawing Sheets

SEMICONDUCTOR DEVICE HAVING INTERCONNECTED EXTERNAL ELECTRODE PADS AND WIRE BONDING PADS

BACKGROUND OF THE INVENTION

1. Field of the Invention

This invention relates to a semiconductor device.

2. Description of the Related Art

A semiconductor device having the following configuration has heretofore been known as a technique in such a field.

In other words, a semiconductor chip or element is placed over a substrate comprised of glass epoxy or the like. Electrodes of the semiconductor element and internal electrodes formed over the substrate are respectively electrically connected to one another by wires. External electrode pads are formed over the back of the substrate and external electrodes are formed on the external electrode pads respectively. The external electrodes and wires or interconnections are electrically connected to one another via through holes defined in the substrate.

This type of technique has been disclosed in Japanese Patent Application Laid-Open No. Hei 10-209321.

SUMMARY OF THE INVENTION

An object of the present invention is to ensure a larger number of positions where through holes are formed and facilitate wire routing.

Another object of the present invention is to improve general versatility of a substrate employed in a semiconductor device.

A further object of the present invention is to restrain contamination of internal electrodes due to the seeping of an adhesive when a semiconductor element is fixed onto a substrate.

According to one aspect of the invention, for achieving the above objects, there is provided a semiconductor device comprising a plurality of external electrode pads which are placed over the back of a substrate having a semiconductor chip mounted on the surface thereof, so as to be substantially parallel with the outer periphery of the substrate, and a plurality of internal electrode pads respectively electrically connected to the external electrode pads via through holes defined in the substrate, which are formed over the surface of the substrate. The internal electrode pads are placed on the surface of the substrate, which corresponds to an area defined by areas in which the external electrode pads are formed and areas lying between the respective adjacent external electrode pads.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1:
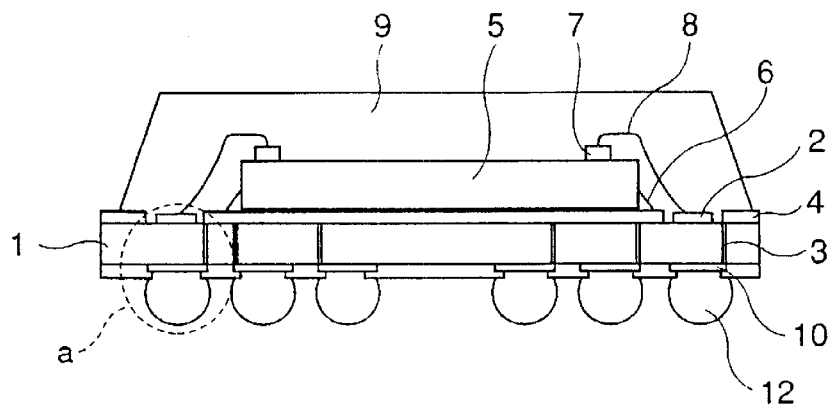
FIG. 1 is a view showing a first embodiment of the present invention.
Figure 3:
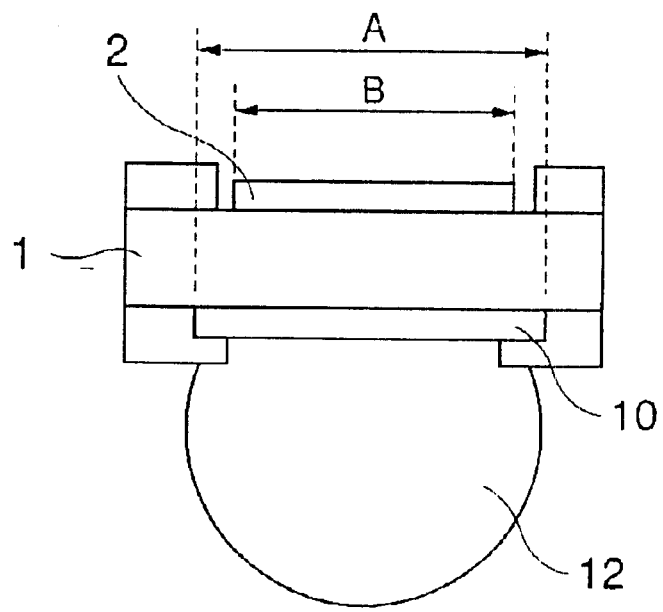
FIG. 3 is a view depicting the first embodiment of the present invention.
Figure 4:
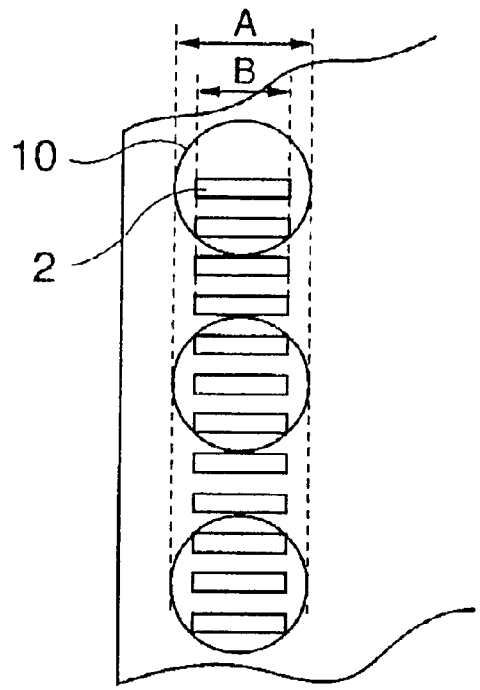
FIG. 4 is a view showing the first embodiment of the present invention.

A first embodiment of the present invention will hereinafter be described with reference FIGS. 1 through 4. FIG. 1 is a cross-sectional view of a semiconductor device of the present invention, FIG. 2 is a perspective view of a substrate unit of the semiconductor device shown in FIG. 1, FIG. 3 is a partially enlarged view of FIG. 1, and FIG. 4 is a partially enlarged view of FIG. 2, respectively.

Figure 2:
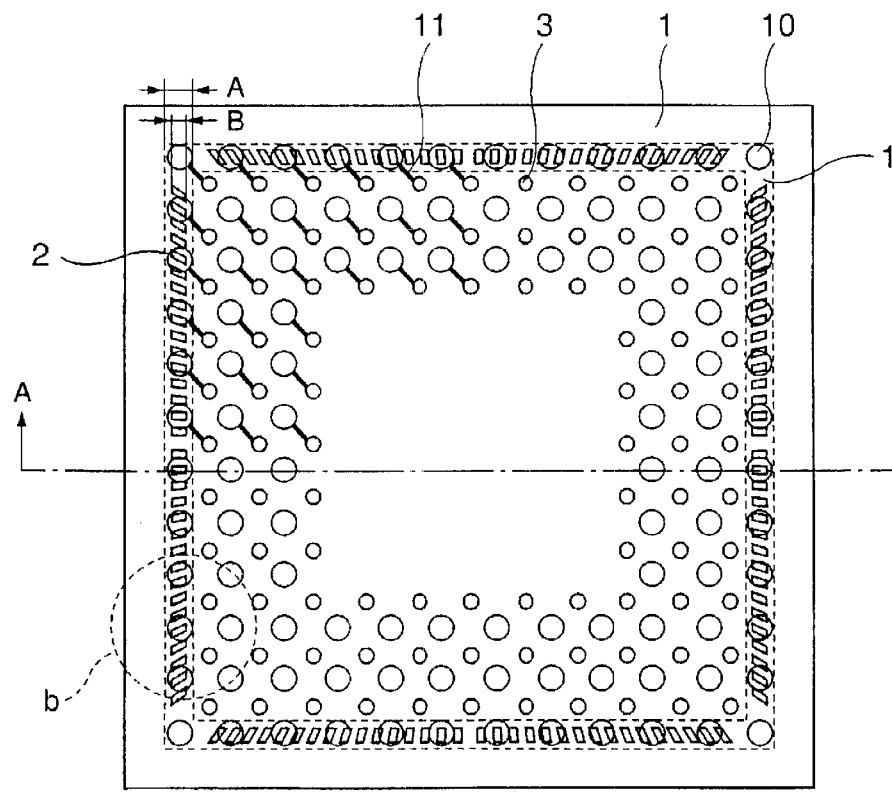
FIG. 2 is a view illustrating the first embodiment of the present invention.

In the semiconductor device according to the present embodiment as shown in FIGS. 1 and 2, wire bonding pads 2 are formed over the surface of a substrate 1. The wire boding pads 2 are formed by bonding copper foil onto the surface of the substrate 1 and patterning it. The wire bonding pads 2 are electrically connected to their corresponding through holes extending through the obverse and reverse of the substrate through unillustrated wires or interconnections. An area excluding the wire bonding pads, on the surface of the substrate 1 is covered with a resist 4.

A semiconductor chip or element 5 is fixed to the central portion of the surface of the substrate 1 with an adhesive 6. The semiconductor element 5 has a plurality of electrode pads 7 provided on the surface thereof. The electrode pads 7 of the semiconductor element 5 and the wire bonding pads 2 are respectively electrically connected to one another by wires 8 comprised of gold or the like.

The semiconductor element 5, wires 8 and wire bonding pads 2 are sealed with a resin 9.

On the other hand, external electrode pads 10 are formed over the back of the substrate 1. The external electrode pads 10 are respectively electrically connected to the wire bonding pads 2 through interconnections 11 formed on the back of substrate 1 and the through holes 3 defined in the back thereof and unillustrated interconnections formed on the surface of the substrate 1. Electrodes 12 such as solder or the like are formed over the external electrode pads 10 respectively.

The external electrode pads 10 are formed in row form along the outer periphery of the substrate 1. The external electrode pads 10 are formed in three rows in FIG. 2. In the first embodiment, the wire bonding pads 2 are placed in an area defined by the outermost peripheral external electrode pads of those arranged in three rows, i.e., an area on the surface of the substrate 1, which corresponds to an area 13 surrounded by broken lines in FIG. 2.

The details thereof are illustrated in FIGS. 3 and 4. FIG. 3 is an enlarged view of a portion surrounded by a in FIG. 1. FIG. 4 is an enlarged view of a portion surrounded by b in FIG. 2. These drawings show the width of the area defined by the external electrode pads 10 as A and the length of each wire bonding pad 2 as B. Thus, the wire bonding pads 2 are formed within the area on the surface of the substrate 1, which corresponds to the area defined by the external electrode pads 10.

Therefore, as shown in FIG. 2, the through holes 3 can be defined in all the areas excluding the area 13 defined by the external electrode pads 10 and areas defined by the external electrode pads 10 formed inside the area 13.

Since the wire bonding pads 2 are placed so as to correspond to the area defined by the external electrode pads 10, the range in which the through holes 3 can be defined, expands and the interconnections are easy to be drawn or routed therethrough. Therefore, excessive wiring can be avoided and the substrate can be improved in yield.

A second embodiment of the present invention will next be described with reference to FIGS. 5 through 7.

Figure 5:
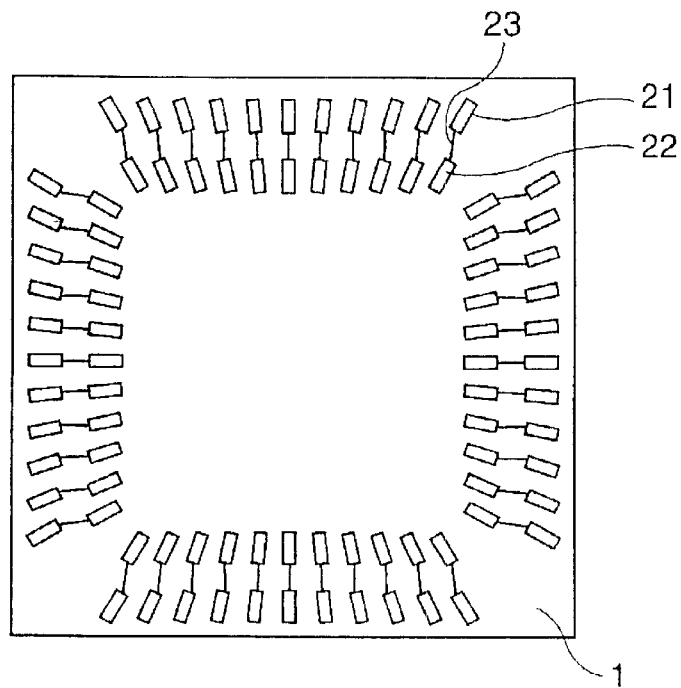
FIG. 5 is a view illustrating a second embodiment of the present invention.

FIG. 5 is a top plan view of a substrate employed in a semiconductor device according to the second embodiment of the present invention as viewed from the mounting-face side of a semiconductor chip or element.

In the second embodiment, wire bonding pads 21 and 22 are formed over a substrate 20. The wire bonding pads 21 are formed along the outer periphery of the substrate 20, whereas the wire bonding pads 22 are formed inside the wire bonding pads 21. These wire bonding pads 21 and wire bonding pads 22 are respectively electrically connected to one another by wires or interconnections 23. These wire bonding pads 21, 22 and interconnections 23 are respectively formed by placing copper coil over the surface of the substrate 20 and patterning it.

Figure 6:
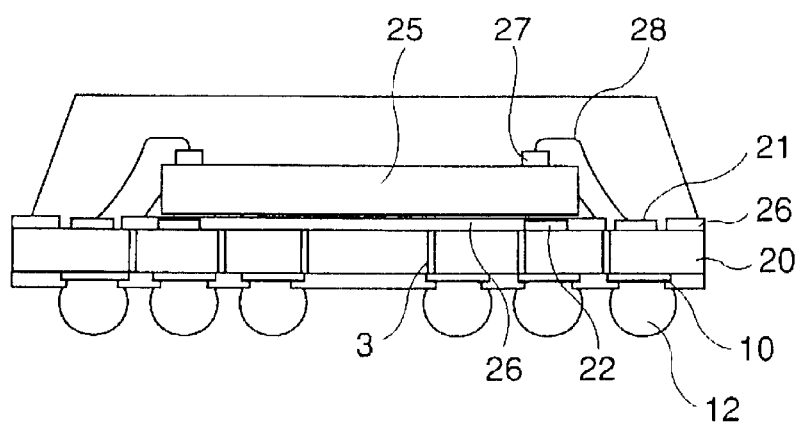
FIG. 6 is a view depicting the second embodiment of the present invention.

An example of the semiconductor device fabricated using such a substrate 20 is shown in FIG. 6.

Referring to FIG. 6, a semiconductor chip or element 25 is mounted on the inwardly-placed wire bonding pads 22 with a resist 26 interposed therebetween. A plurality of electrode pads 27 are formed over the semiconductor chip 25. The electrode pads 27 and the outwardly-provided wire bonding pads 22 are respectively electrically connected to one another by wires 28.

Figure 7:
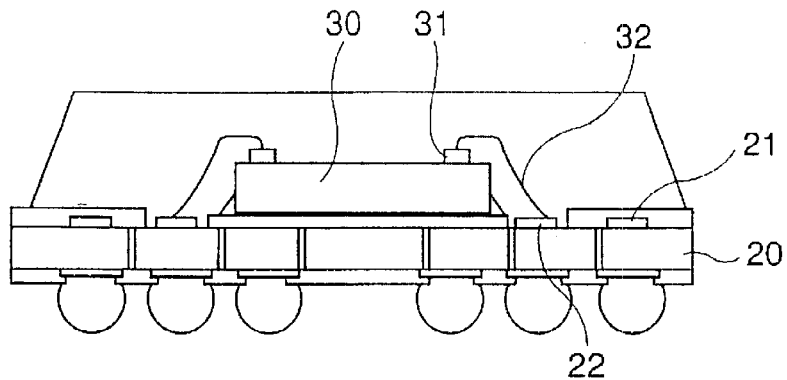
FIG. 7 is a view showing the second embodiment of the present invention.

Alternatively, and referring to FIG. 7, a semiconductor element 30 is placed inside inwardly-provided wire bonding pads 22. Electrode pads 31 of the semiconductor element 30 and the inwardly-placed wire bonding pads 22 are respectively electrically connected to one another by wires 32. Thus, the electrode pads 31 of the semiconductor element 30 can be electrically connected to their corresponding wire bonding pads without lengthening the length of each wire beyond the need.

Thus, the use of the substrate 20 provided with the wire bonding pads 21 and 22 arranged in plural rows and electrically connected to one another allows the utilization of the outwardly-placed wire bonding pads when the semiconductor element is large, and permits the utilization of the inwardly-placed wire bonding pads when the semiconductor element is small.

As a result, the substrate can be improved in general versatility and reduced in its development cost.

In a manner similar to the first embodiment even in the case of the second embodiment, the wire bonding pads 21 and 22 may preferably be placed within an area on the surface of the substrate 20, which corresponds to the area defined by the external electrode pads 10. The placement of the wire bonding pads in this way allows the scale-up of a formable range of through holes 3 and makes it easy to route wiring. Therefore, excessive wiring is no longer necessary and the substrate can be improved in yield.

A third embodiment of the present invention will next be explained with reference to FIGS. 8 and 9.

Figure 8:
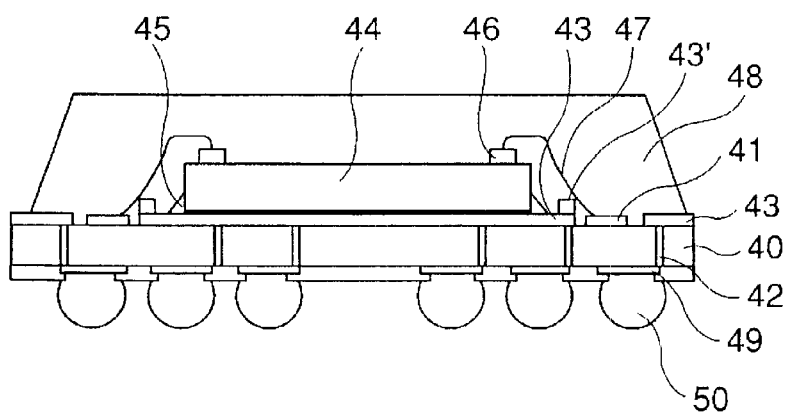
FIG. 8 is a view illustrating a third embodiment of the present invention.

As shown in FIG. 8, a semiconductor device according to the present embodiment has wire bonding pads 41 formed on the surface of a substrate 40. The wire bonding pads 41 are formed by placing copper foil over the surface of the substrate 40 and patterning it. The wire bonding pads 41 are electrically connected to their corresponding through holes 42 extending through the obverse and reverse of the substrate through unillustrated wires or interconnections. An area excluding the wire bonding pads, on the surface of the substrate 40 is covered with a resist 43.

A second resist 43' is formed over the resist 43 lying between a semiconductor chip or element 44 and the wire bonding pads 41. The second resist 43' is formed so as to surround the semiconductor element 44.

The semiconductor element 44 is fixed to the central portion of the surface of the substrate 40 with an adhesive 45. The semiconductor element 44 has a plurality of electrode pads 46 provided over the surface thereof. The electrode pads 46 of the semiconductor element 44 and the wire bonding pads 41 are respectively electrically connected to one another by wires 47 comprised of gold or the like.

The semiconductor element 44, wires 47 and wire bonding pads 41 are sealed with a resin 48.

On the other hand, external electrode pads 49 are formed over the back of the substrate 40. The external electrode pads 49 are respectively electrically connected to the wire bonding pads 41 through interconnections formed on the back of the substrate 40 and the through holes 42 defined in the back thereof, and unillustrated interconnections formed on the surface of the substrate 40. Electrodes 50 such as solder or the like are formed over the external electrode pads 49 respectively.

Thus, the formation of the second resist 43' allows the prevention of contamination of the wire bonding pads 41 due to the outflow and seeping of the adhesive 45 and can provide a stable junction between the wires 47 and wire bonding pads 41.

Since it is not necessary to place a process for cleaning the wire bonding pads 41 before wire bonding in an assembly process, process simplification and a reduction in cost can be expected. Further, since steplike offsets are provided, an electrical failure due to the hanging of the wires 47 can be also reduced.

Figure 9:
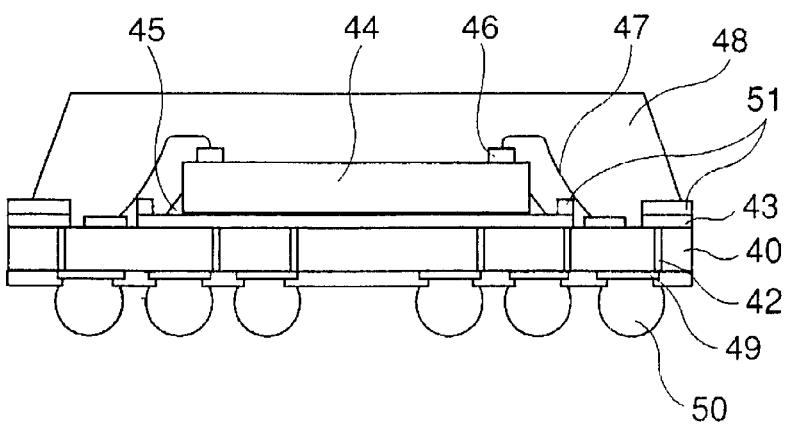
FIG. 9 is a view depicting the third embodiment of the present invention.

In the semiconductor device shown in FIG. 9, a second resist 51 is formed over a resist 43 lying between the semiconductor element 44 and each wire bonding pad 41. The second resist 51 is formed even outside each wire bonding pad 41. An epoxy resin good in adhesion to a sealing resin 48 is used for these second resists.

In general, the resist is bad in adhesion to the sealing resin. Therefore, the separation between the sealing resin 8 and the substrate 40 can be restrained by using the epoxy resin 51 used as the second resist, which is excellent in adhesion to the sealing resin, as the resist.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
a substrate having a first surface and a second surface provided on the opposite side of the first surface;
a plurality of external electrode pads arranged in a row and placed over the first surface of said substrate substantially in parallel with the outer periphery of said substrate, each of said external electrode pads being entirely disposed in a first area that has a length that extends from each said external electrode pad to adjacent ones of said external electrode pads along the row, and that has a maximum width that is defined by an outermost peripheral portion of said external electrode pads;
a plurality of conductive pads formed over the second surface of said substrate and respectively connected to said external electrode pads via through holes defined in said substrate; and
a semiconductor chip provided with a plurality of electrode pads on the surface thereof, which are electrically connected to said external electrode pads and conductive pads respectively, said semiconductor chip being placed over the second surface of said substrate,
wherein said conductive pads are placed over the second surface of said substrate, so as to be disposed only in a second area which is only directly over, and not offset relative to, the first area, and
wherein the through holes are not formed in the second area in which said conductive pads are placed.

2. The semiconductor device according to claim 1, wherein areas lying within said plurality of conductive pads, which are electrically connected to at least the electrode pads of said semiconductor chip, are formed over the second surface of said substrate, which corresponds to the first area.

3. The semiconductor device according to claim 1, wherein a resist layer is provided on the second surface of said substrate so as to fall between said conductive pads and said semiconductor chip.

4. A semiconductor device, comprising:
a substrate having a first surface, and a second surface provided on the opposite side of the first surface;
external electrode pads formed over the first surface and arranged in a row, each of said external electrode pads being entirely disposed in a first area that has a length that extends from each said external electrode pad to adjacent ones of said external electrode pads along the row, and that has a maximum width that is defined by an outermost peripheral portion of said external electrode pads;
a first wire bonding pad group formed over the second surface and placed substantially in parallel with the outer periphery of said substrate and being respectively connected to said external electrode pads via through holes defined in said substrate;
a second wire bonding pad group placed inside said first wire bonding pad group; and
a semiconductor chip mounted on the second surface of said substrate and provided, on the surface thereof, with electrode pads electrically connected to said first or second wire bonding pad group;
wherein said semiconductor chip is placed inside said second wire bonding pad group and the electrode pads of said semiconductor chip are connected to said second wire bonding pad group;
wherein said second wire bonding pad group is disposed only in a second area which is only directly over, and not offset relative to, the first area; and
wherein the through holes are not formed in the second area in which said second wire bonding pad group is placed.

5. A semiconductor device, comprising:
a substrate having a first surface and a second surface provided on the opposite side of the first surface;
a semiconductor chip mounted on the second surface and having a plurality of electrode pads provided on the surface thereof;
a plurality of wire bonding pads formed on the second surface;
wires for electrically connecting the electrode pads of said semiconductor chip and said plurality of wire bonding pads; and
a plurality of external electrode pads arranged in a row and formed over the first surface and electrically connected to said wire bonding pads respectively, each of said external electrode pads being entirely disposed in a first area that has a length that extends from each said external electrode pad to adjacent ones of said external electrode pads along the row, and that has a maximum width that is defined by an outermost peripheral portion of said external electrode pads,
wherein said wire bonding pads are disposed only in a second area which is only directly over, and not offset relative to, the first area,
wherein said wires are respectively connected to said wire bonding pads on the second surface corresponding to the first area; and
wherein said wire bonding pads and said external electrode pads are respectively connected to one another via through holes defined in said substrate, the through holes not being formed in the second area in which said wire bonding pads are disposed.

6. The semiconductor device according to claim 5, wherein said wires and said wire bonding pads are respectively connected to one another on the second surface of said substrate, which corresponds to external electrodes formed on the outermost periphery thereof, of a plurality of said external electrodes formed over the first surface of said substrate, and corresponds to between the external electrodes formed on the outermost periphery thereof.

7. A semiconductor device, comprising:
a substrate which has a first surface and a second surface on an opposite side of the first surface;
a plurality of external electrode pads arranged in a row and being formed on the first surface of the substrate, wherein said external electrode pads are aligned in parallel with the side of the substrate, each of said external electrode pads being entirely disposed in a first area that has a length that extends from each said external electrode pad to adjacent ones of said external electrode pads along the row, and that has a maximum width that is defined by an outermost peripheral portion of said external electrode pads;
a plurality of wire bonding pads formed on the second surface of the substrate, said wire bonding pads being disposed only in a second area which is only directly over, and not offset relative to, the first area; a semiconductor chip mounted on the second surface of said substrate, said semiconductor-chip including a plurality of electrode pads which are electrically connected to the wire bonding pads; and,
wherein a plurality of through holes are formed in the substrate at an area which is different from the second area of where the wire bonding pads are formed, and wherein said external electrode pads are electrically connected to the wire bonding pads via the through holes respectively.

8. The semiconductor device according to claim 7, wherein said electrode pads of the semiconductor chip are connected to the wire bonding pads through a wire.

9. The semiconductor device according to claim 7, further comprising a sealing resin which seals the semiconductor chip and the wire bonding pads.

10. A semiconductor device, comprising:

a substrate which has a first surface and a second surface on an opposite side of the first surface;

a plurality of external electrode pads arranged in a row and being formed on the first surface of the substrate, said external electrode pads including at least one group of external electrode pads which are arranged in a line, each of said external electrode pads of said at least one group being entirely disposed in a first area that has a length that extends from each said external electrode pad of said at least one group to adjacent ones of said external electrode pads of said at least one group along the line, and that has a maximum width that is defined by an outermost peripheral portion of said external electrode pads of said at least one group;

a plurality of wire bonding pads formed on the second surface of the substrate, wherein said wire bonding pads are arranged on the second surface of said substrate only in a second area which is directly over, and not offset relative to, the first area;

a semiconductor chip mounted on the second surface of said substrate, said semiconductor chip including a plurality of electrode pads which are electrically connected to the wire bonding pads; and wherein a plurality of through holes are formed in the substrate at an area which is different from the second area of where the wire bonding pads are formed, wherein said external electrode pads are electrically connected to the wire bonding pads via the through holes respectively.

11. The semiconductor device according to claim 10, wherein said electrode pads of the semiconductor chip are connected to the wire bonding pads through a wire.

12. The semiconductor device according to claim 10, further comprising a sealing resin which seals the semiconductor chip and the wire bonding pads.

* * * * *